United States Patent [19]

Merullo et al.

[11] Patent Number: 4,850,299
[45] Date of Patent: Jul. 25, 1989

[54] SEMICONDUCTOR WAFER COATING APPARATUS WITH ANGULAR OSCILLATION MEANS

[76] Inventors: John G. Merullo; Gary B. Tepolt, both of 7 Shattuck Rd., Andover, Mass. 01810

[21] Appl. No.: 198,080
[22] Filed: May 24, 1988
[51] Int. Cl.⁴ .............................................. B05C 11/02
[52] U.S. Cl. .......................................... 118/52; 118/56
[58] Field of Search ....................... 118/52, 53, 54, 55, 118/56, 57

[56] References Cited

U.S. PATENT DOCUMENTS 2,950,990  8/1960  Johnson .............................. 118/52 X

FOREIGN PATENT DOCUMENTS 0027439  2/1982  Japan ....................................... 118/52
0059265  4/1984  Japan ....................................... 118/52

Primary Examiner—Shrive Beck
Assistant Examiner—Alain Bashore

[57] ABSTRACT

In the coating apparatus disclosed herein, a semiconductor wafer is held on a vacuum chuck mounted on the spindle of a bidirectional servo motor. The servo motor is energized by a servo amplifier in response to the amplitude of the control signal provided to the amplifier. Dispensing means are provided for placing coating material on wafer held in the chuck. An oscillator is provided generating a periodic output signal of controllable amplitude and period. A programmable sequencer is operative in a first time period for appying the oscillatory output signal as a control signal to the servo amplifier thereby to angularly oscillate a wafer held in the chuck and for operating the dispensing means to place a predetermined amount of coating material on the wafer. The sequencing means is operative in a later time period for applying a fixed higher amplitude control signal to the servo amplifier thereby to spin the wafer and spread the coating material.

3 Claims, 3 Drawing Sheets

SEMICONDUCTOR WAFER COATING APPARATUS WITH ANGULAR OSCILLATION MEANS

BACKGROUND OF THE INVENTION

The present invention relates to the manufacture of semiconductor devices and more particularly to apparatus for coating semiconductor wafers.

As is understood by those skilled in the art, the manufacture of semiconductor devices, such as integrated circuits, is typically accomplished by microlithographic or photorepeater techniques which involve exposing a circuit pattern on the surface of a semiconductor wafer which has been coated with a photosensitive resist. After exposure, the resist is developed to reveal the desired pattern for subsequent processing steps. Both the coating and the developing must be precisely controlled in order to repeatably obtain the desired results. As is also understood, both the resist coating and the developing process typically involve the spreading of a thin film of liquid over the surface of the wafer in as uniform a manner as possible.

Particularly in the resist coating operations, it is highly desirable to minimize the amount of coating material used since the materials employed are typically quite expensive. In previously known coating processes, a quantity of resist material is placed on the surface of a wafer and the wafer is then spun, initially at a relatively low speed to spread the material and then at a relatively high speed to reduce the layer to the desired thin film. It has typically been quite difficult to cause the initial spread of the resist to proceed evenly from the center of the wafer to the periphery so that an excess of material was necessary to insure that all portions of the wafer were covered.

Among the several objects of the present invention may be noted the provision of novel apparatus for coating semiconductor wafers with a thin film; the provision of such apparatus which requires a minimum of coating material to effect coating; the provision of such apparatus which provides improved uniformity of coating; the provision of such apparatus which is highly reliable and which is of relatively simple and inexpensive construction. Other objects and features will be in part apparent and in part pointed out hereinafter.

SUMMARY OF THE INVENTION

Briefly, apparatus of the present invention is useful for coating semiconductor wafers. A chuck for holding a wafer to be coated is mounted on a spindle and a bidirectional electric motor is provided for driving the spindle in rotation. Dispensing means are provided for placing coating materials on the surface of the wafer held in the chuck. The motor is energized by servo amplifier means as a function of the amplitude of a control signal provided thereto. An oscillator generates a periodic output signal at selectable amplitude and period. A sequencing means is operative in a first time period for applying the oscillator output signal to the servo amplifier as a control signal thereby to angularly oscillate a wafer held in the chuck and, also during the first time period, operating the dispensing means to place a predetermined amount of coating material on the wafer. The sequencing means is operative in a later time period for applying a fixed higher amplitude control signal to the servo amplifier thereby to spin the wafer.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
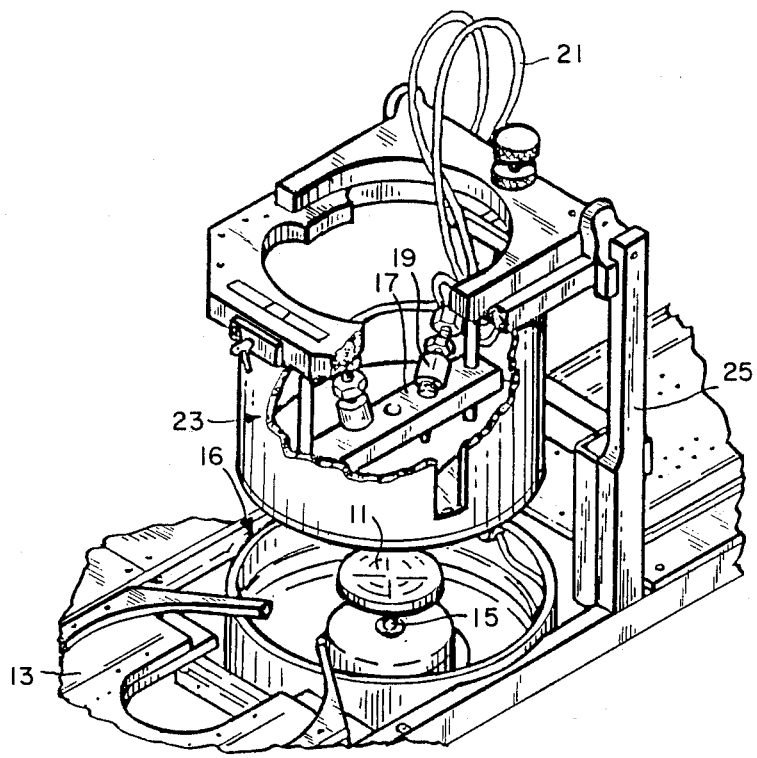
FIG. 1 is a perspective view, with parts broken away, of a spin coating station of the type to which the present invention is applicable.
Figure 2:
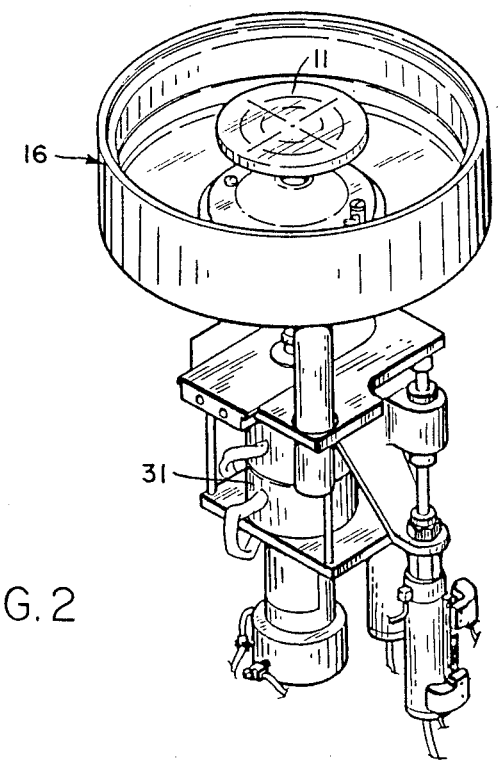
FIG. 2 is a perspective view, with housing parts removed, of the lower portion of the spin station showing a spindle drive motor.

Referring now to FIGS. 1 and 2, the spin coating station illustrated there is of essentially conventional mechanical construction and is essentially the WAFERTRAC model 1006 process station manufactured and sold by GCA Corporation of Andover, Mass., the assignee of the present invention. A wafer to be coated is placed on a vacuum chuck 11 by a transfer mechanism, designated generally by reference character 13. The vacuum chuck 11 is mounted on a spindle 15 so as to be rotatable around a central axis. A cylindrical lower cup assembly 16 surrounds the chuck 11 for catching coating material spun off the wafer as described hereinafter.

A head assembly 17 carries a nozzle 19 through which coating material may be ejected or sprayed onto the upper surface of a wafer held in chuck 11. Nozzle 19 is connected through tubing 21 to a suitable metering pump, not shown in FIG. 1. The head assembly 17 is surrounded by a cylindrical upper cup 23. The head assembly and upper cup together may be raised or lowered with respect to the chuck by means of an elevator assembly 25. As is understood, the spindle and chuck may also be raised and lowered to facilitate the receiving of wafers from the transfer mechanism and coating. These actions are, however, essentially conventional and form no part of the present invention and thus are not described in detail herein.

As is illustrated in FIG. 2, the chuck supporting spindle 15 is driven by a bidirectional electric servo motor designated generally by reference character 31. As is conventional, servo motor 31 is provided with means for generating a feedback signal which represents the actual angular velocity of the spindle and chuck. As is understood, both analog and/or digital feedback signals may be employed.

Figure 3:
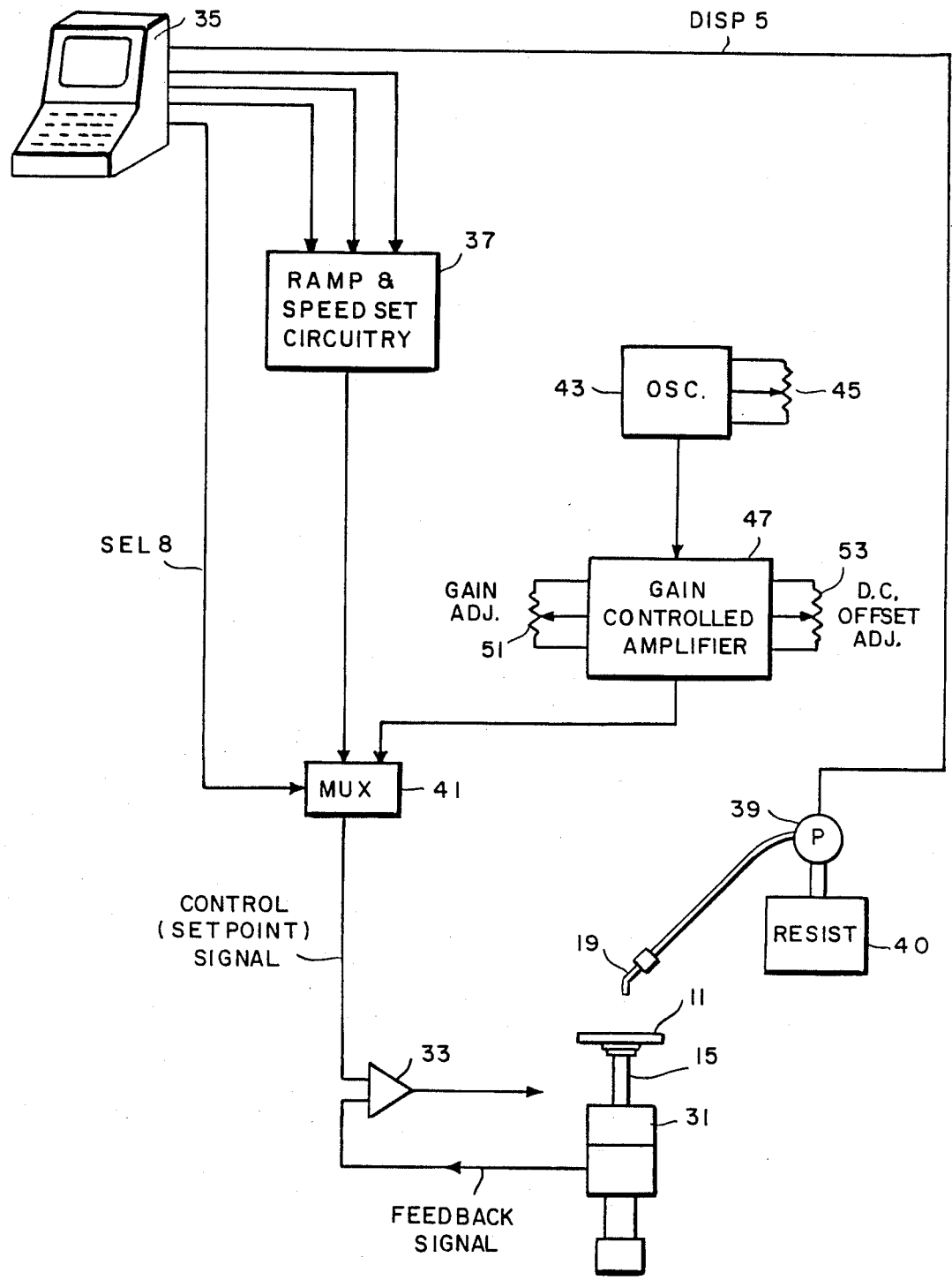
FIG. 3 is a schematic block diagram of motor control circuitry constructed in accordance with the present invention.

As is illustrated in FIG. 3, the servo motor 31 is energized by means of a servo amplifier 33 which operates to control the energization of the motor as a function of the amplitude of a control signal in relation to the actual speed of the spindle as represented by the feedback signal. The standard WAFERTRAC model 1006 incorporates a microprocessor 35 which functions as a digital controller or sequencer, generating various control signals at precisely timed intervals and in response to various sensed conditions as is conventional in the process control arts. The model 1006 also incorporates a conventional ramp and speed signal generating circuit 37 which operates under the control of the microprocessor 35. As is conventional, the speeds and durations over which they are applied can be varied under program control. The microcomputer sequencer also controls the operation of the metering pump 39 which pumps photoresist coating material to the nozzle 19 from a suitable reservoir 40. This control signal is designated DISP5.

Figure 4:
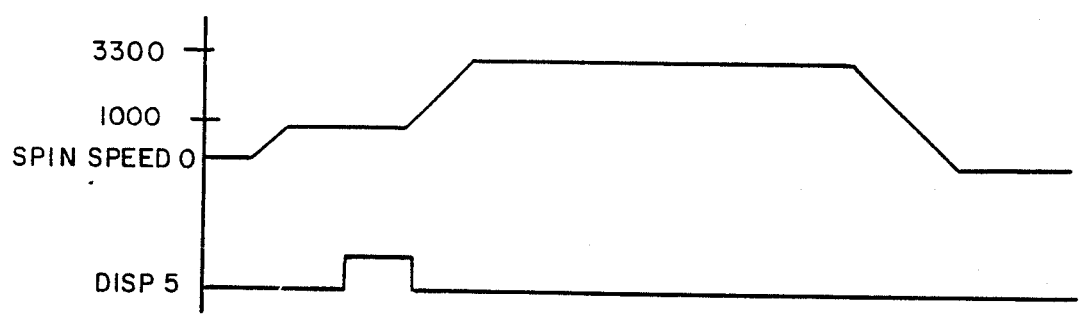
FIG. 4 is a graph representing a motor spindle speed pattern in accordance with the prior art practices.

FIG. 4 represents the conventional mode of operation of the model 1006 in coating wafers with resist. Once a wafer is placed on the chuck and the chuck moves the wafer into proximity of the dispensing nozzle, the spindle speed is ramped up to angular velocity of about 1000 rpm. After the wafer has reached this speed and stabilized, the dispensing pump 39 is energized for a period appropriate to dispense the desired amount of resist onto the wafer. During this period the resist, deposited near the center of the wafer, spreads across the upper surface of the wafer. Typically, this is not a highly regular spread but, rather, will evidence significant peaks or radial rays of material. These peaks or rays will reach the periphery of the wafer long before intervening areas are fully covered and thus there is some appreciable wastage of the coating material. After a time sufficient to insure that the entire wafer surface will be wetted with the resist material, the spindle speed is ramped up to an angular velocity of essentially 3300 rpm. This speed is maintained for about 30 seconds during which time the coating is brought down to a thin film of the desired thickness.

In accordance with the practice of the present invention, an oscillatory rotation of the spindle is provided during the application of resist material. In the prior art system referenced previously, the analog output signal from the ramp speed control circuit 37 would be applied directly to the servo amplifier 33 as its control signal. In the apparatus illustrated, an analog multiplexer 41 permits the sequencer 35 to select between the output signal of the ramp and speed circuit 37 and an output signal derived from an oscillator circuit 43. The sequencer signal controlling the multiplexer 41 is designated SEL8. Oscillator 43 generates a sinewave having a frequency which is adjustable by means of a potentiometer 45. The output signal from the oscillator 43 is applied as an input to the analog multiplexer 41 through an amplifier circuit 47. Amplifier 47 includes both means for adjusting its gain, i.e. a potentiometer 51, and for adjusting the d.c. offset of the output signal from the amplifier, i.e. potentiometer 53. Thus, the periodic sinewave signal applied as the second input to the analog multiplexer 41 is adjustable as to period, amplitude and d.c. offset.

Figure 5:
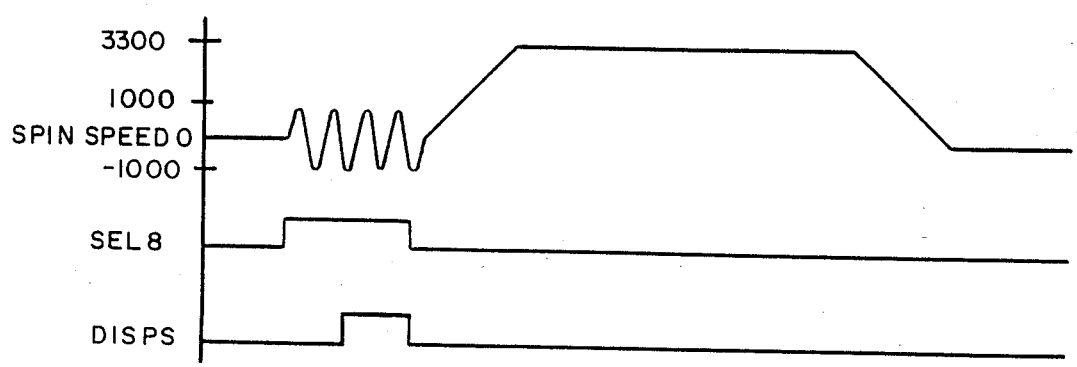
FIG. 5 is a diagram illustrating motor spindle speed behavior in accordance with the present invention.

As indicated previously, the operation of the servo amplifier 33 is to control the energization of the servo motor 31 in a sense tending to maintain the angular velocity of the spindle and chuck at a value which is essentially proportional to the amplitude of the control signal applied to the servo amplifier. In the embodiment illustrated, the output signal of the oscillator 43 is adjusted to essentially 10 hertz and the gain of the amplifier 47 is adjusted so that the peak angular velocity corresponds to the rotational speed of about 1000 rpm. The resulting behavior of the chuck speed is represented in FIG. 5. As may be seen, the chuck is caused to angularly oscillate and, during this period of oscillation, the resist is dispensed on the upper surface of the wafer held in the chuck. While the exact fluid mechanical effects are not fully understood, it has been found that, using the oscillatory action during dispensing, the resist spreads out over the wafer in a pattern which is much more circular, evidencing fewer peaks or rays. The leading edge of the spreading pool appears as something of a wave spreading outwardly. After the resist has spread, the wafer is then again spun at a higher speed, e.g. 3300 rpm to thin down the film, as in the prior procedures.

Because of the more even initial spread of the resist on the surface of the wafer, it has been found that substantially less resist may be used. For example, in coating five inch silicon wafers with Shipley-type 1400-24 resist using the conventional spin coating technique illustrated in FIG. 4, it was necessary to utilize a minimum of 3 cubic centimeters of resist for each wafer whereas with the oscillatory spreading action illustrated in FIG. 5 it was possible to achieve equivalent or even superior results using 1.4 cubic centimeters of resist or even less. It is also believed, based upon visual observation, that a superior uniformity of coating was ultimately achieved though no quantitative results have yet been obtained.

In some circumstances, it may also be desired to superimpose the oscillatory motion upon a steady rotational speed. This can be achieved with the apparatus illustrated by appropriately adjusting the d.c. offset so that the output signal from the amplifier 47 includes a d.c. component proportional to the steady rotation desired. In effect, the superimposed rotation will in effect precess the wafer within the sinusoidal oscillation.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. Apparatus for coating semiconductor wafers, said apparatus comprising:
    a spindle;
    mounted on said spindle, a chuck for holding a semiconductor wafer;
    dispensing means for placing coating material on the surface of a wafer held in said chuck;
    bidirectional electric motor means for driving said spindle in rotation;
    amplifier means for energizing said motor as a function of the amplitude of a control signal to obtain an angular velocity of said spindle which varies as a function of said control signal;
    an oscillator for generating a periodic output signal;
    sequencing means operative in a first time period for applying said oscillator output signal to said servo amplifier means as a control signal thereby to angularly oscillate a wafer held in said chuck and for operating said dispersing means to place a predetermined amount of coating material on such wafer and operative in a later time period for applying a fixed, higher amplitude control signal to said servo amplifier means thereby to spin said wafer.

2. Apparatus for coating semiconductor wafers, said apparatus comprising:
    a spindle;

mounted on said spindle, a chuck for holding a semiconductor wafer;
dispensing means for placing coating material on the surface of a wafer held in said chuck;
bidirectional electric motor means for driving said spindle in rotation, said motor being provided with means for generating a feedback signal which varies as a function of the angular velocity of said spindle;
servo amplifier means for energizing said motor as a function of the amplitude of a control signal in relation to said feedback signal to obtain an angular velocity of said spindle which varies as a function of said control signal;
an oscillator for generating a periodic output signal said amplifier including means for varying the period of the output signal;
means for varying the amplitude of said output signal;
sequencing means operative in a first time period for applying said oscillator output signal at controlled amplitude to said servo amplifier means as a control signal thereby to angularly oscillate a wafer held in said chuck and for operating said dispensing means to place a predetermined amount of coating material on such wafer and operative in a later time period for applying a fixed, higher amplitude control signal to said servo amplifier means thereby to spin said wafer.

3. Apparatus for coating semiconductor wafers, said apparatus comprising:

a spindle;
mounted on said spindle, a vacuum chuck for holding a semiconductor wafer;
metering pump means for dispensing photoresist onto the surface of a wafer held in said chuck;
bidirectional electric servo motor means for driving said spindle in rotation, said motor being provided with means for generating a feedback signal which varies as a function of the angular velocity of said spindle;
servo amplifier means for energizing said motor as a function of the amplitude of a control signal in relation to said feedback signal to obtain an angular velocity of said spindle which varies as a function of said control signal;
an oscillator for generating a sinusoidal output signal, said amplifier including means for varying the period of the output signal;
amplifier means driven by said oscillator, said amplifier having means for adjusting gain;
sequencing means operative in a first time period for applying the output signal from said gain controlled amplifier to said servo amplifier means as a control signal thereby to angularly oscillate a wafer held in said chuck and for operating said metering pump to place a predetermined amount of photoresist onto such wafer and operative in a later time period for applying a fixed, higher amplitude control signal to said servo amplifier means thereby to spin said wafer.

* * * * *